US012733226B2

(12) United States Patent
Qi et al.

(10) Patent No.: US 12,733,226 B2
(45) Date of Patent: Sep. 8, 2026

(54) TRANSISTOR DEVICE AND MANUFACTURING METHOD THEREOF

(71) Applicant: SUZHOU LOONGSPEED SEMICONDUCTOR TECHNOLOGY CO., LTD., Suzhou (CN)

(72) Inventors: Jinwei Qi, Suzhou (CN); Yaohui Zhang, Suzhou (CN)

(73) Assignee: SUZHOU LOONGSPEED SEMICONDUCTOR TECHNOLOGY CO., LTD., Suzhou (CN)

( * ) Notice: Subject to any disclaimer, the term of this patent is extended or adjusted under 35 U.S.C. 154(b) by 403 days.

(21) Appl. No.: 18/566,051

(22) PCT Filed: Apr. 14, 2022

(86) PCT No.: PCT/CN2022/086861
§ 371 (c)(1),
(2) Date: Nov. 30, 2023

(87) PCT Pub. No.: WO2023/197256
PCT Pub. Date: Oct. 19, 2023

(65) Prior Publication Data

US 2024/0266401 A1 Aug. 8, 2024

(51) Int. Cl.
*H10D 62/17* (2025.01)
*H10D 12/01* (2025.01)
(Continued)

(52) U.S. Cl.
CPC ......... *H10D 62/393* (2025.01); *H10D 12/031* (2025.01); *H10D 30/668* (2025.01);
(Continued)

(58) Field of Classification Search
CPC .. H10D 62/393; H10D 12/031; H10D 30/668; H10D 62/8325; H10D 30/0297;
(Continued)

(56) References Cited

U.S. PATENT DOCUMENTS 10,861,931 B2 12/2020 Lichtenwalner et al.
2014/0231867 A1 8/2014 Yamashita et al.
(Continued)

FOREIGN PATENT DOCUMENTS

CN 102208414 A 10/2011
CN 109065628 A 12/2018
(Continued)

OTHER PUBLICATIONS

Notice of Reasons for Refusal issued in counterpart Japanese Patent Application No. JP 2023-571842, dated Nov. 19, 2024.
(Continued)

*Primary Examiner* — Evan G Clinton
(74) *Attorney, Agent, or Firm* — Westbridge IP LLC

(57) ABSTRACT

Disclosed are a transistor device and a manufacturing method thereof. The transistor device includes a gate, a gate insulator, and a drift region stacked with the body region in a first direction, the gate insulator covers the bottom surface and at least a portion of the side surface of the gate, the body region covers a portion of the sidewall of the gate insulator, and the gate insulator is extended from the surface of the drift region facing the body region to the drift region along the first direction; the body region comprises a first subregion, a second subregion and a third subregion arranged sequentially along a second direction, an average carrier concentration in the first subregion and an average carrier concentration in the third subregion are greater than an average carrier concentration in the second subregion.

18 Claims, 5 Drawing Sheets

(51) Int. Cl.
*H10D 30/66* (2025.01)
*H10D 62/832* (2025.01)
*H10P 30/20* (2026.01)

(52) U.S. Cl.
CPC ..... *H10D 62/8325* (2025.01); *H10P 30/2042* (2026.01); *H10P 30/222* (2026.01)

(58) Field of Classification Search
CPC .. H10D 62/314; H10P 30/2042; H10P 30/222
See application file for complete search history.

(56) References Cited

U.S. PATENT DOCUMENTS

| | | | | |
|---|---|---|---|---|
| 2014/0264562 | A1 | 9/2014 | Cheng et al. | |
| 2021/0296447 | A1* | 9/2021 | Kyogoku | H10D 62/393 |
| 2023/0299150 | A1* | 9/2023 | Tanaka | H10D 30/668 257/295 |

FOREIGN PATENT DOCUMENTS

| | | | | | |
|---|---|---|---|---|---|
| CN | 109417090 | A | | 3/2019 | |
| CN | 114068720 | A | * | 2/2022 | H10D 64/513 |
| JP | 2008066708 | A | | 3/2008 | |
| JP | 2019096711 | A | | 6/2019 | |
| JP | 2020043309 | A | * | 3/2020 | H10D 62/393 |
| JP | 2020126932 | A | | 8/2020 | |
| WO | 2018163593 | A1 | | 9/2018 | |
| WO | 2019186224 | A1 | | 10/2019 | |

OTHER PUBLICATIONS

International Search Report issued in corresponding PCT Application No. PCT/CN2022/086861, dated Nov. 2, 2022.
European Search Report issued in counterpart European Patent Application No. EP 22936904.6, dated Jun. 13, 2024.

* cited by examiner

TRANSISTOR DEVICE AND MANUFACTURING METHOD THEREOF

CROSS-REFERENCE TO RELATED APPLICATIONS

This application Stage of International Application No. PCT/CN/2022/086861, filed on Apr. 14, 2022, the content of which is incorporated herein by reference in its entirety.

TECHNICAL FIELD

The present disclosure relates to the technical field of semiconductor devices, in particular to a transistor device and a manufacturing method thereof.

BACKGROUND

Semiconductor transistors, especially field-effect-controlled switching devices such as Metal-Oxide-Semiconductor Field Effect Transistor (MOSFET), have been used in many situations such as power supplies and power converters. Many of these applications are high-power applications that require transistors to be able to carry high current and/or high voltage.

The power transistor can be implemented as a vertical MOS trench transistor, which can have a voltage blocking capability up to several hundred volts and a rated current higher than one ampere. In a vertical transistor, the gate can be arranged in a trench extending in a vertical direction of the semiconductor main body. The gate is electrically insulated from the source, the body region, and the drift region of the transistor (e.g., via a gate insulator), and the gate and the body region are arranged in a transverse direction (the transverse direction is perpendicular to the vertical direction). The drain can be connected to the drift region. Under positive conduction conditions, the device channel is formed by the inversion region of the body region near the gate oxide along the vertical direction.

Silicon carbide (SiC) offers specific excellent properties as a substrate material for power transistors. The specific properties of silicon carbide lead to higher voltage blocking capability at a given on-resistance than semiconductor devices using other substrate materials (such as silicon substrate semiconductor devices). For example, silicon carbide has a higher critical electric field, that is, the electric field of avalanche breakdown. Therefore, the transistor based on the silicon carbide has a higher breakdown voltage. The silicon carbide devices can be significantly thinner and have lower on-state resistance, which allows the transistor device to have a lower capacitance and gate charge, and further enhances the switching characteristics of the device. Moreover, the transistor based on the silicon carbide has the excellent high-temperature operating ability, which can not only be operated at high temperature conditions (e.g., operating temperature greater than 175° C.), but also have a small increase in on-resistance at high temperature.

However, the related arts of the transistor device based on the silicon carbide are facing some challenges. For example, due to the limitation of process conditions, in the transistor device based on the silicon carbide, defects may exist at the interface between the silicon carbide body and the gate insulator (of which material is, for example, silicon dioxide, $SiO_2$), resulting in a poor quality of the vertical channel, which leads to a lower electron mobility and an increased on-resistance. In order to take full advantage of the silicon carbide, it is necessary to overcome the problem of channel defects.

SUMMARY

According to one aspect, the present disclosure provides a transistor device comprising a gate, a gate insulator, and a drift region stacked with the body region in a first direction. The gate comprises a top surface, a bottom surface arranged opposite to the top surface, and a side surface between the top surface and the bottom surface, the bottom surface is in the first direction of the top surface, the gate insulator covers the bottom surface and at least a portion of the side surfaces of the gate, the gate insulator comprises a sidewall and a bottom, the body region covers a portion of the sidewall of the gate insulator, and the gate insulator is extended from a surface of the drift region facing the body region to the drift region along the first direction. The body region comprises a first subregion, a second subregion, and a third subregion arranged sequentially along a second direction, the second direction is perpendicular to the first direction and pointing to a direction away from the gate insulator, and the average carrier concentration in the first subregion and the average carrier concentration in the third subregion are greater than the average carrier concentration in the second subregion.

In some embodiments, the average carrier concentration in the second subregion is 60% to 80% of the average carrier concentration in the third subregion.

In some embodiments, the average carrier concentration in the first subregion is 90% to 100% of the average carrier concentration in the third subregion.

In some embodiments, both the first subregion and the third subregion comprise a doped substance of a first conductive type, the drift region comprises a dopant substance of a second conductive type, the second subregion comprises the dopant substance of the first conductive type and the dopant substance of the second conductive type, in addition, in the second subregion, the average dopant concentration of the doped substance of the second conductive type is 20% to 40% of the average dopant concentration of the doped substance of the first conductive type.

In some embodiments, a distance between a midline of the second subregion along the first direction and the sidewall of the gate insulator ranges from 5 nm to 10 nm.

In some embodiments, a width of the second subregion along the second direction is 60% to 100% of a distance between the midline of the second subregion along the first direction and the sidewall of the gate insulator.

In some embodiments, in the drift region, at the location aligned with the second subregion along the first direction, a dopant concentration rising region is existed, the average dopant concentration of the doped substance of the second conductive type in the dopant concentration rising region is greater than the average dopant concentration of the doped substance of the second conductive type in the drift region.

In some embodiments, the base material of the body region and the drift regions is silicon carbide.

In some embodiments, a dimension of the gate insulator in the second direction is 2 to 5 times a dimension of the gate insulator in the first direction.

According to another aspect, the present disclosure provides a manufacturing method of the transistor device, comprising: providing an initial body region and a drift region stacked in the first direction: forming a gate trench inside the initial body region and the drift region, where the gate trench passes through the initial body region from a surface of the initial body region backward away from the drift region in the first direction, and is extended inside the drift region; injecting a doped substance into the initial body region by an ion implantation process to obtain a buried trench body region, where the buried trench body region comprises a first subregion, a second subregion and a third subregion, the first subregion, the second subregion and the third subregion are sequentially arranged along a second direction, the second direction is perpendicular to the first direction and pointing to a direction away from the gate trench, the average carrier concentration in the first subregion and the average carrier concentration in the third subregion are greater than the average carrier concentration in the second subregion.

In some embodiments, the step of injecting a doped substance into the initial body region by the ion implantation process to obtain a buried trench body region comprises: injecting an ion beam containing the doped substance into the initial body region through the gate trench in a direction at a non-zero angle to the second direction.

In some embodiments, the step of injecting an ion beam containing the doped substance into the initial body region through the gate trench in a direction at a non-zero angle to the second direction comprises: injecting the ion beam into the initial body region at different angles during at least two ion implantation process.

In some embodiments, the angle between the ion beam and the second direction ranges from 30° to 60°.

In some embodiments, the temperature of the ion implantation process ranges from 500° C. to 700° C.

In some embodiments, the base materials of the initial body region and the drift region are silicon carbide, and the method further comprises: thermally oxidizing the gate trench to from a silicon oxide gate oxide on the inner wall of the gate trench.

In some embodiments, the method further comprises: after injecting a doped substance into the initial body region by an ion implantation process to obtain a buried trench body region, annealing the buried trench body region in the range of 1500° C. to 1700° C.

BRIEF DESCRIPTION OF THE DRAWINGS

In order to more clearly describe the technical solutions in the embodiments of the present disclosure, the accompanying drawings to be used in the embodiments will be briefly described below. Obviously, the accompanying drawings in the following description are only some embodiments of the present disclosure, and other drawings can be obtained from these accompanying drawings without paying creative labor for those of ordinary skill in the art. in the accompanying drawings of the present disclosure.

DETAILED DESCRIPTION OF THE EMBODIMENTS

The technical solutions in the embodiment of the present disclosure will be clearly and completely described below in conjunction with the accompanying drawings in the embodiment of the present disclosure. Obviously, the described embodiments are only a portion of the embodiments of the present disclosure and not all of the embodiments. Based on the embodiments in the present disclosure, all other embodiments obtained by a person of ordinary skill in the art without making creative labor fall within the scope of protection of the present disclosure.

In the accompanying drawings, specific embodiments of a semiconductor device and a manufacturing method of a semiconductor device are shown by way of illustration. It is to be understood that other embodiments can be utilized and structural or logical changes can be made without departing from the scope of the present disclosure. For example, features illustrated or described with respect to one embodiment may be used on other embodiments, or used in combination with other embodiments to produce yet a further embodiment. The scope of the present disclosure comprises such modifications and changes.

It should be understood that the accompanying drawings are not to scale, and are only intended for illustrative purposes and not for limiting purposes.

Terms such as “have”, “contain”, “comprise”, etc. are open. These terms indicate the presence of certain structures, elements or features, but do not exclude the presence of other additional structures, elements or features. The quantifier “one” does not exclude the plural, unless the context clearly indicates otherwise.

The gate insulator of a silicon carbide-based trench transistor can be obtained by thermally oxidizing a silicon carbide base material near the gate trench to silicon dioxide. The inventors found that during thermal oxidation, the residual carbon atoms will create interface defects, resulting in the appearance of interface state. The interface state refers to a state in which the electrons are confined near the interface between silicon carbide and silicon dioxide. This causes serious interface scattering of channel carriers, when the transistor device is in the forward conduction state, in especial ionized impurity scattering. The ionized impurity scattering means that the donor impurity becomes a positively charged ion after ionization, and the acceptor impurity becomes a negatively charged ion after ionization. A Coulomb potential field is formed around the ionized donor or the ionized acceptor, which partially destroys the periodic potential field near the impurity. When the carriers move to the vicinity of the ionized impurity, both the speed and the direction of their motion will change. As a result, the channel resistance of the transistor device is too large. At the same gate-source voltage, the obtained drain current is smaller.

Figure 1:
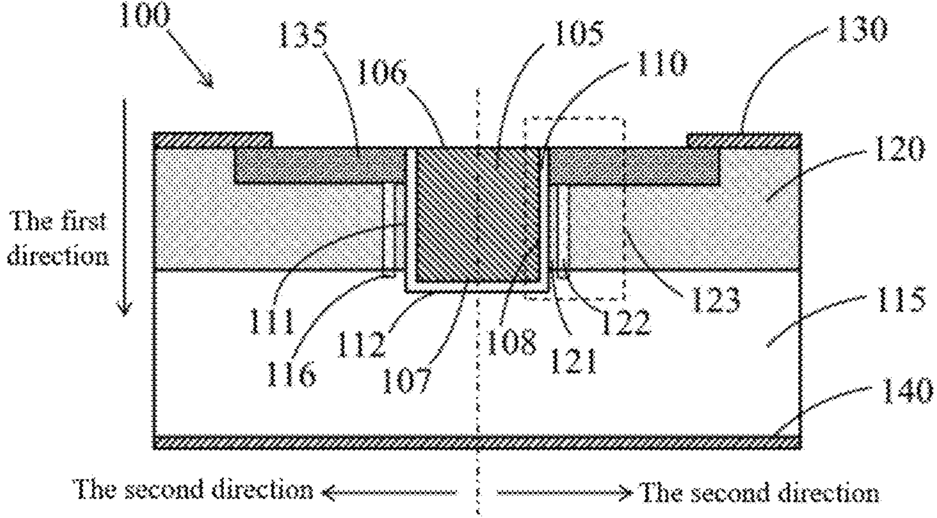
FIG. 1 schematically illustrates a cross-sectional view of the transistor device according to an embodiment of the present disclosure.

According to one aspect, the present disclosure provides a transistor device. FIG. 1 schematically illustrates a cross-sectional view of the transistor device according to an embodiment of the present disclosure. As shown in FIG. 1, the transistor device 100 comprises a gate 105, a gate insulator 110, a body region 120, and a drift region 115 stacked with the body region 120 in a first direction. The gate 105 comprises a top surface 106, a bottom surface 107 arranged opposite to the top surface, and a side surface 108 between the top surface 106 and the bottom surface 107. The bottom surface 107 is in the first direction of the top surface 106. The gate insulator 110 covers the bottom surface 107 and at least a portion of the side surfaces 108 of the gate 105. The gate insulator 110 comprises a sidewall 111 and a bottom 112. The body region 120 covers a portion of the sidewall 111 of the gate insulator 110. The gate insulator 110 is extended from the surface of the drift region 115 facing the body region 120 to the drift region 115 along the first direction. The body region 120 comprises a first subregion 121, a second subregion 122 and a third subregion 123 arranged along the second direction. The second direction is perpendicular to the first direction and pointing to a direction away from the gate insulator 110. The average carrier concentration in the first subregion 121 and the average carrier concentration in the third subregion 123 are greater than the average carrier concentration in the second subregion 122.

The above structure is described in detail below. In the transistor device according to an embodiment of the present disclosure, the body region 120 and the drift region 115 are stacked in the first direction. That is, the specific direction of the first direction is determined by the relative position of the body region 120 and the drift region 115 inside the transistor device 100. Both the body region 120 and the drift region 115 are part of the main body of the transistor device, and both can be formed by doping different types and concentrations of impurities in the base material. In some embodiments, the aforementioned base material can be silicon carbide. The impurities in the drift region 115 can be group V elements, such as nitrogen, of which concentration can be in the range of $10^{14}$ cm$^{-3}$ to $10^{16}$ cm$^{-3}$, for example about $10^{15}$ cm$^{-3}$. The thickness of the drift region 115 that is the dimension of the drift region 115 in the first direction is related to the voltage level. In general, the higher the voltage level, the thicker the thickness of the drift region 115. For example, when the voltage level of the transistor device is 1200 V, the thickness of the drift region 115 can be 12 μm; and when the voltage level of the transistor device is 1700 V, the thickness of the drift region 115 can be 17 μm. The transistor device of the embodiment of the present disclosure is intended for above 650 V, and the thickness of the drift region 115 may be 6.5 μm or thicker, and at least 6.0 μm. The impurities of the body region 120 can comprise Group III elements, such as aluminum, which can have a concentration in the range of $3.5\times10^{16}$ cm$^{-3}$ to $3.5\times10^{18}$ cm$^{-3}$. The thickness of the body region 120 is non-related to the thickness of the drift region 115. In some embodiments, the thickness of the body region 120 can be in the range of 0.3 μm to 0.9 μm. For example, the thickness of the body region 120 can be about 0.6 μm.

The gate 105 comprises a top surface 106, a bottom surface 107 and a side surface 108 sandwiched between the top surface and the bottom surface. The gate insulator 110 covers the bottom surface 107 and at least a portion of the side surfaces 108 of the gate 105, that is the top surface 106 of the gate 105 is exposed. Therefore, the top surface 106 of the gate 105 can be used to connect to a circuit (e.g., a gate line) of the control circuit and to receive a control signal. In some embodiments, the material of the gate 105 can be polycrystalline silicon.

The body region 120 surrounds a part of the sidewall 111, and the gate insulator 110 is extended from the side of the drift region 115 facing the body region 120 to the drift region 115 along the first direction. Taking the perspective and direction shown in FIG. 1 as an example, the above features can be understood to mean that the gate insulator 110 (and the gate surrounded by the gate insulator 110) passes through the entire body region 120 from top to bottom, and after passing through the body region 120, continues to extend downward and enters the drift region 115. The dimension of the gate insulator 110 along the first direction can be in the range of 0.7 μm to 1.3 μm. When the thickness of the body region 120 is 0.6 μm, the depth of the gate insulator 110 into the drift region 115 can be in the range of 0.1 μm to 0.7 μm.

When the gate 105 is provided with a control signal, an inversion region will appear in the body region near the gate insulator 110, forming a channel having the opposite conductive type to the opposite conductive type of the body region. For example, when the body region is P-type, after applying a positive bias voltage to the gate, an N-type channel will be formed in the body region on both sides of the gate insulator 110, making the device to conduct. The channel will be formed along the sidewall of the gate insulator 110. The gate insulator 110 is extended to the drift region 115, and the channel also is extended from the body region 120 to the drift region 115.

The body region 120 comprises a first subregion 121, a second subregion 122 and a third subregion 123 arranged sequentially along the second direction. The second direction is perpendicular to the first direction. Taking the perspective and direction shown in FIG. 1 as an example, the first direction is a vertical direction, and the second direction is a horizontal direction. Moreover, the second direction is away from the gate insulator 110, which can be understood as that the second direction takes the gate insulator 110 as the starting point and points away from the gate insulator 110. As shown in FIG. 1, the directions outward from the midline of the gate insulator 110 in the first direction (including the direction from the midline to the left and to the right) are both the second direction. The first subregion 121, the second subregion 122 and the third subregion 123 are arranged along the second direction, indicating that in the horizontal direction and among the three subregions, the first subregion 121 is closest to the gate insulator 110, the second subregion 122 is next closest, and the third subregion 123 is farthest from the gate insulator 110.

The average carrier concentration in the first subregion 121 and the average carrier concentration in the third subregion 123 are greater than the average carrier concentration in the second subregion 122. First of all, it should be noted here that the "average carrier concentration" is the average value of the carrier concentration inside each subregion of the body region of the transistor device when it is not energized. The above features indicate that along the second direction, the carrier concentrations in the body region 120 first decrease and then increase. With this setting of the carrier concentration in the body region, the channel will be formed in the second subregion 122 after the control signal is provided to the gate.

In the conventional technology, the carrier concentration in the body region of a transistor device is generally uniform everywhere. When such a transistor device is in a forward conduction state, the channel will be formed at the interface between the gate oxide (material such as silicon dioxide) and the body region (material such as silicon carbide). As mentioned above, there is an interface defect at this interface that results in an interface state. When the transistor device is in the forward conduction state, channel carriers will experience severe interface scattering, which results in the channel resistance of the transistor device being too large.

In the present disclosure, in the direction away from the gate insulator 110, the carrier concentrations in the body region 120 first decrease and then increase. In this way, the position of the channel is shifted from the interface between the gate oxide and the body region to a region where the carrier concentrations decrease, that is, the second subregion 122. This avoids the problem of carrier interface scattering when the transistor device is in the conduction state, thereby reducing the channel resistance and improving the performance of the silicon carbide MOSFET device.

Figure 2:
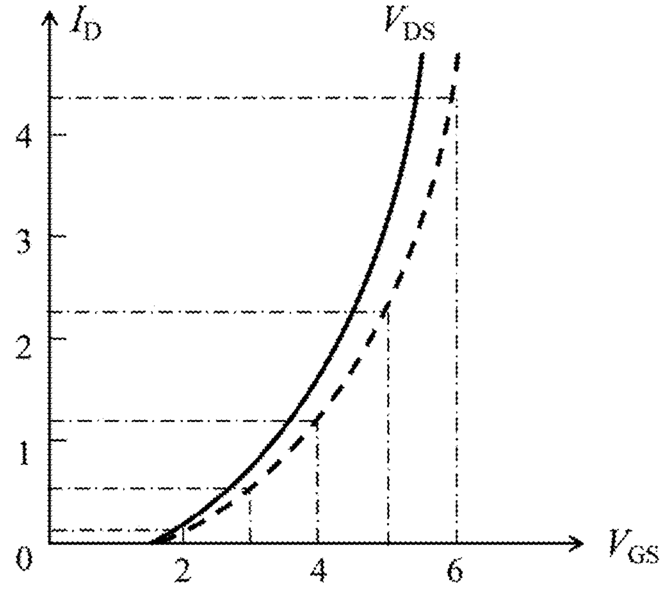
FIG. 2 schematically illustrates an input characteristic curve of a transistor device and an input characteristic curve of a related transistor device according to an embodiment of the present disclosure.

FIG. 2 schematically illustrates an input characteristic curve of a transistor device according to an embodiment of the present disclosure and an input characteristic curve of a related transistor device. In FIG. 2, the dashed line represents an input characteristic curve of a related transistor device, and the solid line represents an input characteristic curve of a transistor device of an embodiment of the present disclosure. As can first be seen from FIG. 2, the transistor device according to an embodiment of the present disclosure is an enhanced transistor device. Moreover, as shown in FIG. 2, after reaching the turn-on voltage, the slope of the input characteristic curve of the transistor device according to an embodiment of the present disclosure is greater under the same gate-source voltage VGS, and the transistor device according to the present disclosure has a higher drain current ID, which indicates that it has a smaller channel resistance.

Figure 3:
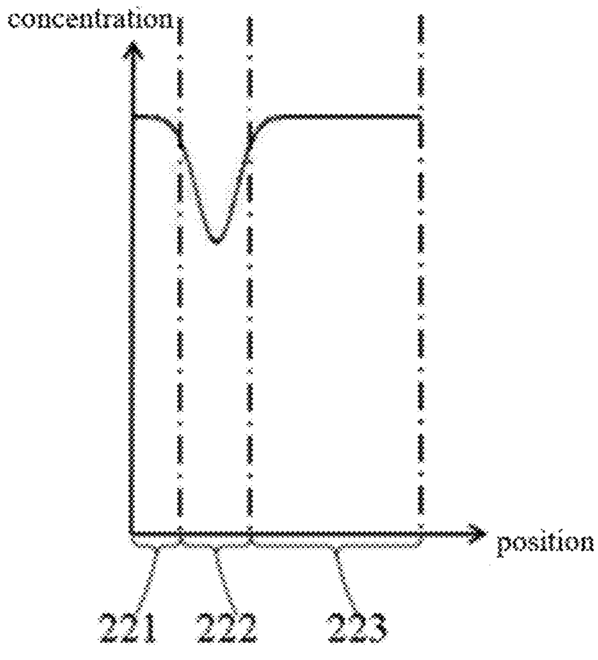
FIG. 3 schematically illustrates the distribution of carrier concentrations in the body region of the transistor device according to an embodiment of the present disclosure.

The average carrier concentration inside each subregion can be determined and verified by the Spread Resistance Profile (SRP). FIG. 3 schematically illustrates the distribution of carrier concentrations in the body region of the transistor device according to an embodiment of the present disclosure. In FIG. 3, the horizontal axis represents the internal locations of the body region 120, specifically the distance between each location inside the body region and the interface between the gate insulator 110 and the body region 120. The vertical axis represents the carrier concentration. The drawing reference 221 can be understood as the range of the first subregion 121 in the second direction, the drawing reference 222 can be understood as the range of the second subregion 122 in the second direction, and the drawing reference 223 can be understood as the range of the third subregion 123 in the second direction. As can be seen in FIG. 3, the carrier concentration at each location in the second subregion 122 is less than the carrier concentration at each location in the first subregion 121 and the carrier concentration at each location in the third subregion 123. Therefore, the average carrier concentration in the first subregion 121 and the average carrier concentration in the third subregion 123 are greater than the average carrier concentration in the second subregion 122.

In some embodiments, the average carrier concentration in the second subregion 122 is 60% to 80% of the average carrier concentration in the third subregion 123. When the difference between the average carrier concentration of the second subregion 122 and the third subregion 123 reaches this range, the channel can be effectively shifted to the interior of the body region, avoiding the problem of larger channel resistance caused by the defect at the interface of the gate oxide and the body region.

In order to achieve the distribution of the aforementioned average carrier concentration inside each subregion, in some embodiments, both the first subregion 121 and the third subregion 123 comprise the doped substance of the first conductive type. The drift region comprises the doped substance of the second conductive type. The second conductive type is a conductive type opposite to the first conductive type. The second subregion 122 comprises the doped substance of the first conductive type and the doped substance of the second conductive type. In a transistor device, the drift region and the body region are generally doped with the doped substances of different conductivity types. For example, in an N channel vertical transistor device, the body region can be doped with P-type impurities and the drift region can be doped with N-type impurities. The first subregion 121, the second subregion 122 and the third subregion 123 all include the doped substance of the first conductive type and the second subregion 122 also comprises a doped substance of the second conductive type. The first type carrier of the doped substance of the first conductive type and the second type carrier of the doped substance of the second conductive type can be combined such that both carriers are neutralized. For example, the doped substance of the first conductive type can be a group III element and the carriers are holes; and the doped substance of the second conductive type can be a group IV element and the carriers are electrons. When the second subregion is doped with both the doped substance of the first conductive type and the doped substance of the second conductive, the electron of the doped substance of the first conductive type and the hole of the doped substance of the second conductive type can combine to electron-hole pairs and enter a stable state, no longer acting as a carrier. There, the average carrier concentration in the second subregion is reduced. In summary, in the present disclosure, by injecting the doped substance with two conductive types into the second subregion to neutralize each other, achieving an arrangement of the average carrier concentration inside each subregion according to embodiments of the present disclosure.

In a more specific embodiment, in the second subregion, the average dopant concentration of the doped substance of the second conductive type is from 20% to 40% of the average dopant concentration of the doped substance of the first conductive type. This can be understood as that 20% to 40% of the carriers of the doped substance of the first conductive type are neutralized, so that the average carrier concentration of the second subregion decreases by 20% to 40% with respect to the average carrier concentration of the unneutralized third subregion, that is the average carrier concentration of the second subregion is 60% to 80% of the average carrier concentration of the third subregion.

In the embodiment of the present disclosure, it is hoped that the decrease of the average carrier concentration only occurs in the second subregion, while the average carrier concentration in the first subregion and the third subregion is substantially unaffected. For example, in some embodiments, the average carrier concentration in the first subregion 121 is 90% to 100% of the average carrier concentration in the third subregion 123. This can be achieved using an ion implantation process. After injecting the doped substance of the second conductive type into the body region by the ion implantation process, the concentration distribution of the doped substance of the second conductive type inside the body region 120 is a Gaussian distribution. That is, starting from the gate insulator 110, the concentration of the doped substance of the second conductive type first increases and then decreases after reaching a peak. In order to realize that both the average carrier concentration of the first subregion and the average carrier concentration of the third subregion are greater than the average carrier concentration of the second subregion, it is required that the concentration peak of the doped substance of the second conductive type occurs in the second subregion.

Figure 4:
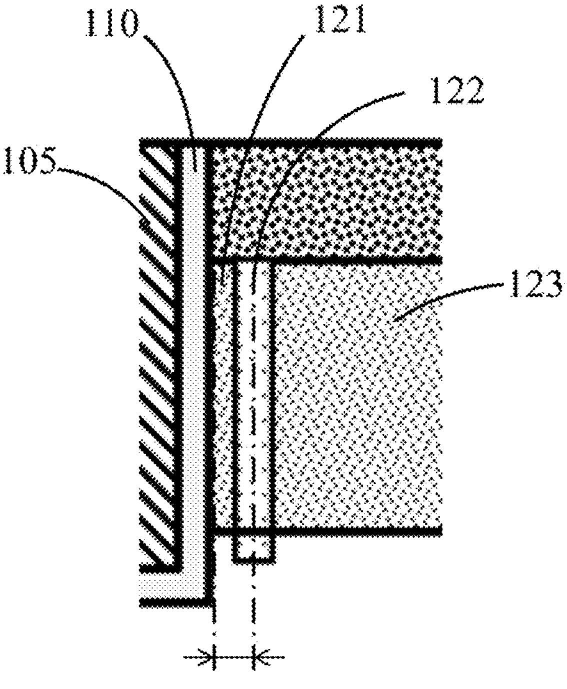
FIG. 4 schematically illustrates a partially enlarged view of the cross-sectional view of the transistor device according to an embodiment of the present disclosure.

In some embodiments, a distance between the midline along the first direction of the second subregion 122 and the sidewall of the gate insulator 110 ranges from 5 nm to 10 nm. FIG. 4 schematically illustrates a partially enlarged view of the transistor device of FIG. 1. Specifically, FIG. 4 magnifying shows a portion of the dashed wire frame in the FIG. 1. Through an auxiliary line, showing the distance of the midline of the second subregion 122 from the sidewall of the gate insulator 110. By setting the distance in the range of 5 nm to 10 nm, the channel is properly offset, which not only avoids a defect at the interface of the gate oxide and the body region, but also makes the channel remain within the effective control range of the electric field of the gate 105.

In some embodiments, a width of the second subregion 122 along the second direction is 60% to 100% of a distance between the midline of the second subregion and the sidewall of the gate insulator 110. The term "width" can be understood as the dimension of the second subregion in the second direction according to the perspective of FIG. 1. In an embodiment of the present disclosure, the width of the second subregion can be set according to the distance between the midline thereof and the gate insulator. For example, if the distance between the midline of the second subregion and the sidewall of the gate insulator is a first distance, the range of the second subregion in the second direction can start from the midline of the second direction and respectively extend 30% to 50% of the first distance to the both sides of the midline. In a more specific embodiment, starting from the midline of the second subregion and extending 40% of the first distance to both sides. For example, as mentioned earlier, the distance of the midline of the second subregion 122 from the sidewall of the gate insulator 110 can be 5 nm. Taking this as an example, the range of the second subregion 122 can be extended by 2 nm from a midline of the second subregion 122 to both sides. At this time, the width of the second subregion 122 is 4 nm.

In some embodiments, in the drift region 115, at the location aligned with the second subregion 122 along the first direction, a dopant concentration rising region 116 exists. The average dopant concentration of the doped substance of the second conductive type in the dopant concentration rising region 116 is greater than the average dopant concentration of the doped substance of the second conductive type in the drift region 115. In the transistor device 100, the channel not only exists in the second subregion of the body region 120, but also the drift region 115 during the forward conduction, so that a current can enter the drift region 115 from the body region 120 along the channel. When injecting the doped substance of the second conductive type into the second region 122 by ion implantation process, a part of the doped substance of the second conductive type will enter the drift region 115 and the position is aligned with the second subregion 122. The term "aligned" should be understood to mean that the orthographic projection of the second subregion 122 at the drain 140 is at least partially coincident with the orthographic projection of the doping concentration rise region 116 at the drain 140. Since the part of the doped substance of the second conductive is added to the drift region 115, the doping concentration in the region where the newly added doped substance of the second conductive type is located will increase to form the dopant concentration rising region 116. The present disclosure does not limit the extent to which the dopant concentration rising region 116 is extended inside the drift region 115.

In some embodiments, a size of the gate insulator 110 in the second direction is 2 to 5 times a size of the gate insulator 110 in the first direction. In the fabrication process of the transistor device according to an embodiment of the present disclosure, it is first necessary to form a gate trench in a stack of the material of the body region and the material of the drift region, and then using an ion beam passes through the gate trench and bombards the sidewall of the gate trench at an inclined angle by an ion implantation process to form the body region into the first subregion, the second subregion, and the third subregion aforementioned. The thickness of the gate insulator 110 can be between 1 nm and 100 nm, and the gate insulator 110 can have a size of up to 1 μm in the first direction. That is, the thickness of the gate insulator 110 has little effect on its dimensions. Accordingly, the feature "the dimension of the gate insulator 110 in the second direction is 2 to 5 times the dimension of the gate insulator 110 in the first direction" can be understood as that the dimension of the gate trench in the second direction is 2 to 5 times the dimension in the first direction. This dimension setting of the gate trench can make the ion beam inclination angle of the aforementioned ion implantation process have a large adjustment space. This is conducive to better control of the average carrier concentration in the first subregion, the second subregion and the third subregion.

In some embodiments, as shown in FIG. 1, the transistor device further comprises a source 130, a drain 140 and a heavy doping source region 135 located at a side of the body region 120 away from the drift region 115. The body region 120 can comprises a low thickness region relatively closer to the gate 105 and a high thickness region away from the gate 105. The heavy doping source region 135 is located on the low thickness region. The doped substance of the heavy doping source region 135 is the same as the aforementioned doped substance of the second conductive type injected into the second subregion 122 of the body region 120, for example, the doped substance of the heavy doping source region 135 can be a group V element, such as nitrogen. The concentration of the doped substance of the heavy doping source region 135 should be at least one order of magnitude higher than that of the doped substance of the second conductive type in the second subregion 122, for example, in the range of $10^{19}$ $cm^{-3}$ to $10^{20}$ $cm^{-3}$. As shown in FIG. 1, the source 130 covers both the body region 120 and the heavy doping source region 135. The source 130 can be a stack of various metal materials. For example, in a direction opposite to the first direction, the source can comprise a titanium layer, a nickel layer and an aluminum layer. Through nickel elements and titanium elements, the ohmic contact between the aluminum layer and the silicon carbide semiconductor main body can be strengthened and the work function can be reduced. The thickness range of the source can be from 4 μm to 8 μm. In some embodiments, the thickness of the source can be 5 μm. The drift region 115, the body region 120 and the heavy doping source region 135 together constitute the semiconductor main body of the transistor device.

In summary, according to an embodiment of the present disclosure, the carrier concentrations in the body region first decrease and then increase along the direction away from the gate, so that the channel is separated from the interface between the gate insulator and the body region when the transistor device is forward conduction, thus avoiding the interface scattering problem faced by the channel carriers, reducing the channel resistance and improving the performance of the transistor device.

According to another aspect of the present disclosure, a manufacturing method of the transistor device is further provided. Through this method, the transistor device according to any one of the embodiments of the present disclosure can be obtained. The manufacturing method of the transistor device is introduced below.

Figure 5:
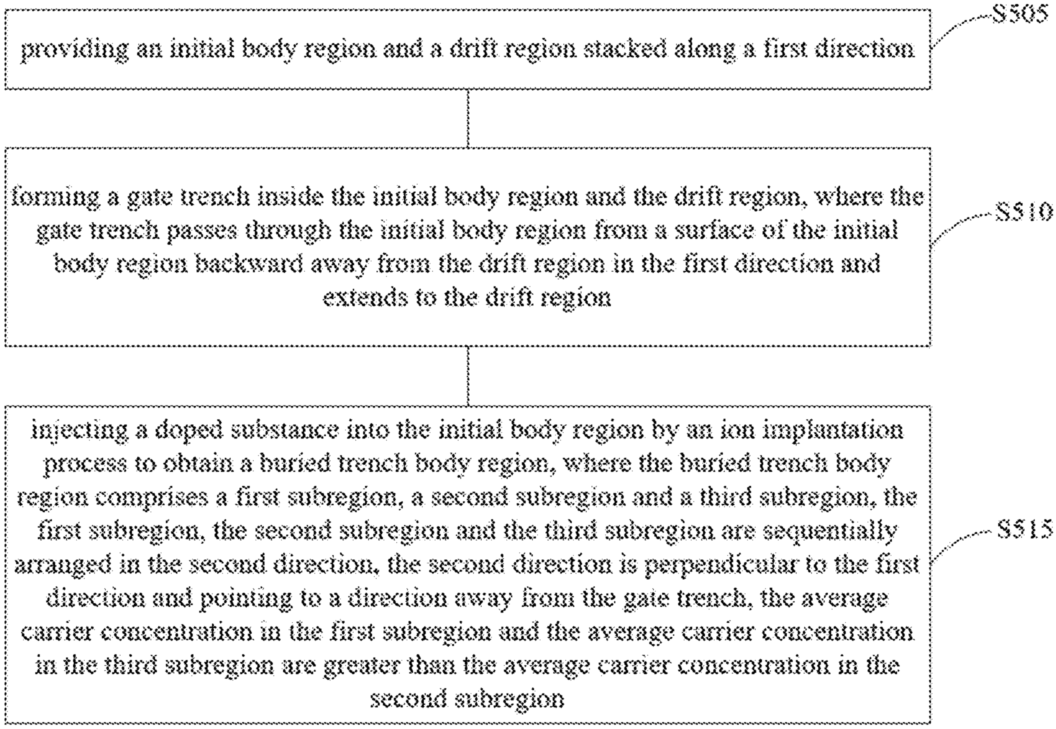
FIG. 5 schematically illustrates a flowchart of a manufacturing method of a transistor device according to an embodiment of the present disclosure.

FIG. 5 schematically illustrates a flowchart of a manufacturing method of a transistor device according to an embodiment of the present disclosure. FIGS. 6A to 6F schematically illustrate, respectively, the configuration of a transistor device at various stages of a manufacturing method of a transistor device according to an embodiment of the present disclosure.

As shown in FIG. 5, the method comprises:

Step S505, providing an initial body region and a drift region stacked along a first direction:

Step S510, forming a gate trench inside the initial body region and the drift region, where the gate trench passes through the initial body region from a surface of the initial body region backward away from the drift region in the first direction and extends to the drift region; and Step S515, injecting a doped substance into the initial body region by an ion implantation process to obtain a buried trench body region, where the buried trench body region comprises a first subregion, a second subregion and a third subregion, the first subregion, the second subregion and the third subregion are sequentially arranged in the second direction, the second direction is perpendicular to the first direction and pointing to a direction away from the gate trench, the average carrier concentration in the first subregion and the average carrier concentration in the third subregion are greater than the average carrier concentration in the second subregion.

The steps are described below.

Figure 6A:
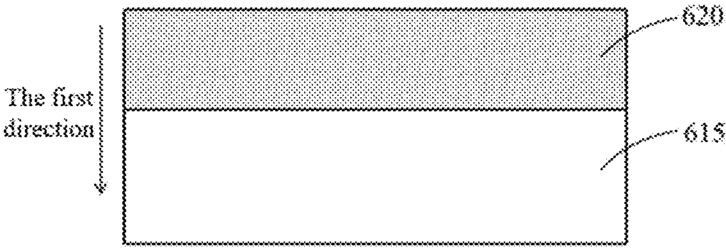
FIGS. 6A to 6F schematically illustrate, respectively, the configuration of a transistor device at various stages of a manufacturing method of a transistor device according to an embodiment of the present disclosure.

First, providing an initial body region and a drift region stacked along a first direction (step S505). The carrier concentration in the initial body region is basically the same everywhere. In actual production, a semiconductor substrate can be provided first and then an epitaxial layer can be grown on the semiconductor substrate, that is the drift region. The drift region can have N-type impurities with relatively low concentration. The N-type impurities can be group V elements, such as nitrogen. Then, injecting P-type impurities into the drift region using an ion implantation process to obtain the body region. The P-type impurities can be group III elements, such as aluminum. As shown in FIG. 6A, the initial body region 620 and the drift region 615 are stacked in the first direction.

Figure 6B:
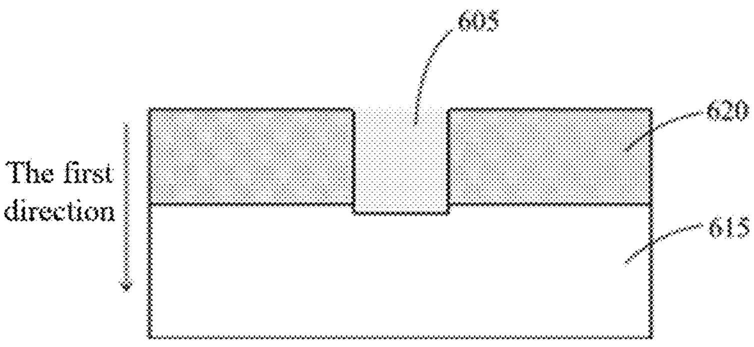

Then, a gate trench is formed in the initial body region and the drift region (step S510). As shown in FIG. 6B, in this step, the gate trench 605 passes through the initial body region 620 from the surface of the initial body region 620 backward away from the drift region 615 in the first direction, and is extended into the drift region 615. This step can be carried out by etching. It should be noted that the process of obtaining the gate trench by etching should not have an effect on the impurity concentration inside the initial body region and the drift region. During the etching process, the gate trench should extend through the entire initial body region and extend inside the drift region. The width of the gate trench can be at least 3 μm, for example in the range of 3 μm to 5 μm, or even up to 10 μm.

In some embodiments, the cross-sectional shape of the gate trench can be a rectangular, as shown in FIG. 6B. In other embodiments, the cross-sectional shape of the gate trench also can be an inverted trapezoidal or even a V-shaped. That is, the bottom width of the gate trench is smaller than the top width. In some embodiments, there is a rounded chamfer between the sidewall and the bottom of the gate trench, which can have the effect of preventing breakdown.

Figure 6C:
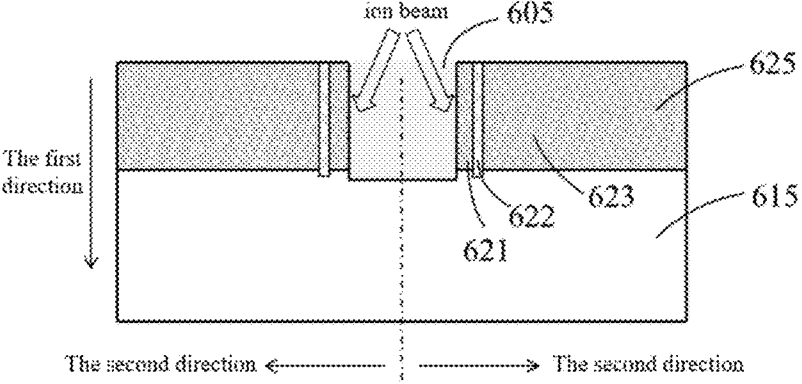

After forming the gate trench, it can inject a doped substance into the initial body region by the ion implantation process to obtain a buried trench body region (step S515). As shown in FIG. 6C, the buried trench body region 625 comprises a first subregion 621, a second subregion 622, and a third subregion 623. The first subregion 621, the second subregion 622 and the third subregion 623 are sequentially arranged along the second direction. The second direction is perpendicular to the first direction and pointing to a direction away from the gate trench 605. The average carrier concentration in the first subregion 621 and the average carrier concentration in the third subregion 623 are greater than the average carrier concentration in the second subregion 622. The term "buried trench body region" should be understood as the structure formed in the initial body region after being injected with the doped substance. The conductivity of the injected doped substance should be opposite to the conductivity of the original doped substance in the initial body region. Through the above characteristics, it can be understood that in this step, the effect of the ion implantation process is to make the average carrier concentration of the buried trench body region first decrease and then increase in the direction away from the gate trench. Therefore, the transistor device fabricated by this method can realize various excellent effects as previously mentioned which comprise: the channel is separated from the interface between the gate insulator and the body region when at forward conduction, thus avoiding the interface scattering problem faced by the channel carriers, reducing the channel resistance and improving the performance of the transistor device. In the ion implantation process, a portion of the ions can also extend inside the drift region 615 and the specific extension degree is not limited.

In some embodiments, the temperature range of the ion implantation process is from 500° C. to 700° C. This is because the silicon carbide base material needs to complete ion implantation in a high temperature environment. The dose of the ion implantation can make the average carrier concentration in the second subregion 60% to 80% of the average carrier concentration in the initial body region. The position of the second subregion 622 with respect to the sidewall of the gate trench 605 and the width of the second subregion 622 along the second direction have been described previously and are not repeated here.

In more specific embodiments, step S515 can specifically comprises: injecting an ion beam containing the doped substance into the initial body region through the gate trench in a direction at a non-zero angle to the second direction. As shown in FIG. 6C, the direction of the ion beam is at a non-zero angle to the second direction. The ion beam is tilted into the gate trench 605 and bombards the sidewall and bottom of the gate trench, allowing the dopant elements to enter into the initial body region and the drift region.

In order to make the effect of the ion injection better and the impurity concentration inside the second subregion more uniform, the form of multiple injection can be used. For example, above-mentioned "injecting an ion beam containing the doped substance into the initial body region through the gate trench in a direction at a non-zero angle to the second direction" can comprise: Injecting the ion beam inject into the initial body region at different angles during at least two ion injection processes. In multiple injections, the injection angle of each ion beam can be different. When the angle between the ion beam and the second direction is small, the ion beam will mainly bombard the upper portion of the sidewall of the gate trench: when the angle between the ion beam and the second direction is large, the ion beam will mainly bombard the lower portion of the sidewall of the gate trench and the bottom of the gate trench. The number and angle of the ion injection are related to the aspect ratio of the gate trench. The smaller the aspect ratio of the gate trench, the deeper the gate trench is, and more times of the ion injection can be required. In some embodiments, the minimum value of the angle between the ion beam and the second direction can be 30° and the maximum value can be 60°. For example, in the first ion injection, the angle between the ion beam and the second direction is 30°; and in the second ion injection, the angle between the ion beam and the second direction is 60°. In some embodiments, in order to obtain a better ion injection effect, three or more ion injections are required.

After the ion implantation process, an annealing operation can be performed on the semiconductor main body. Specifically, the method according to an embodiment of the present disclosure further comprises: after injecting a doped substance into the initial body region by an ion implantation process to obtain a buried trench body region, annealing the buried trench body region in the range of 1500° C. to 1700° C. Annealing can repair the lattice damage and make the impurity atoms move to lattice points to activate the lattice points. When the base material is silicon carbide, the required annealing temperature is higher. In some implementations, the annealing temperature is set in the range of 1500° C. to 1700° C. to ensure the effect of annealing.

Figure 6D:
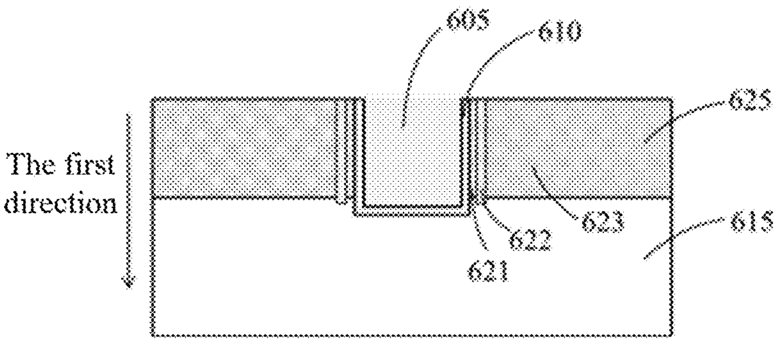

After forming the buried trench body region and making the average carrier concentration inside each subregion meet the aforementioned requirements, the gate oxide can be formed. Specifically, when the base material is silicon carbide, the method further comprises: thermally oxidizing the gate trench to form a silicon oxide gate oxide on the inner wall of the gate trench. As shown in FIG. 6D, the silicon carbide substrate is oxygenated by thermally oxidizing the gate trench 605. The oxygen atoms and the carbon atoms in the silicon carbide substrate form a silicon oxide gate oxide 610, which can have a thickness in the range of 1 nm to 100 nm.

Figure 6E:
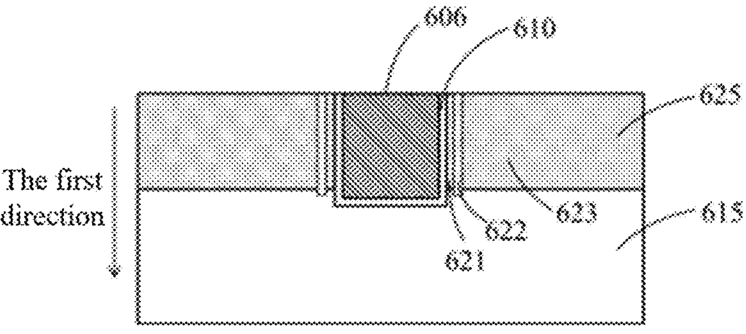

Subsequently, as shown in FIG. 6E, the gate 606 is formed inside the gate trench 605. The material of the gate can be polycrystalline silicon. Specifically, the gate can be formed by depositing polycrystalline silicon materials and etching the polycrystalline silicon materials.

Figure 6F:
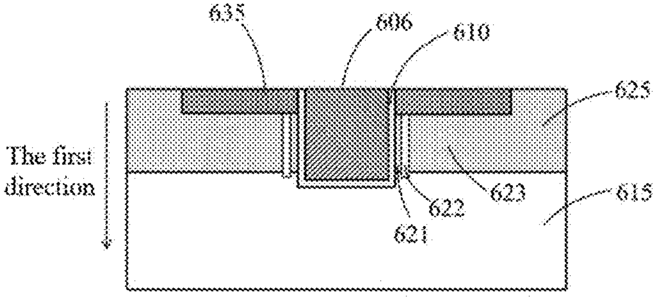

Then, as shown in FIG. 6F, the heavy doping source region 635 can be formed inside the buried trench body region 625. Specifically, ions can be injected into the buried trench body region 625, and the injected ions are the same as those injected in the process of forming the second subregion 622 above-mentioned. For example, if the ion implantation process of step S515 injects nitrogen ions into the initial body region, the process of forming the heavy doping source region should also inject nitrogen ions. The ion concentration in the process of forming the heavy doping source region should be higher. For example, the impurity concentration in the heavy doping source region can range from $10^{19}$ $cm^{-3}$ to $10^{20}$ $cm^{-3}$. After the above steps, a semiconductor main body having a drift region, a body region, a gate insulator, a gate, and a heavy doping source region is obtained, and the carrier concentration in the body region first decrease and then increase along a direction away from the gate insulator.

Afterwards, a source and a drain can be formed on the obtained semiconductor main body to obtain a transistor device according to an embodiment of the present disclosure as shown in FIG. 1. The formation process of source and drain can be achieved by depositing metal materials and etching patterns.

The transistor device fabricated by the above method will have the advantages of the transistor device described above according to the embodiment of the present disclosure, which will not be repeated here.

In the description of the present disclosure, in order to be clearer and easier to understand, the embodiment of the present disclosure is mainly taking a N-channel transistor device as an example. However, the present disclosure is also applicable to a P-channel transistor device, as long as the type and concentration of the doped substance are adjusted accordingly.

As will be understood by those skilled in the art, although the steps of the method in the implementation of the embodiment of the present disclosure are described in a specific order in the attached figure, but this does not require or imply that these steps must be performed in that specific order, unless the context otherwise specifies. Additional or replaceable, multiple steps can be merged into one step execution, and/or a step is broken down into multiple steps execution. In addition, other method steps can be inserted between steps. The inserted step can represent improvements to the method described in this article, or can be unrelated to the method. In addition, a given step cannot be fully completed before the next step begins.

In the description of the embodiment of the present disclosure, the terms "up", "down", "left", "right", etc. indicate an orientation or positional relationship based on that shown in the accompanying drawings. It is only intended for the convenience of describing the embodiment of the present disclosure rather than to require that the embodiment of the present disclosure must be constructed and operated in a particular orientation, and therefore are not to be construed as a limitation of the present disclosure.

In the description of this specification, the describe reference to the terms "one embodiment", "another embodiment", etc. are means that the specific features, structures, materials or characteristics described in conjunction with the embodiment conjunction are included in at least one embodiment of the present disclosure. In this specification, the indicative expression of the above terms need not be directed to the same embodiment or example. Moreover, the specific features, structures, materials, or characteristics described can be combined in any one or more embodiments or examples in a suitable manner. In addition, without contradicting each other, a person skilled in the art can combine the different embodiments or examples and features of different embodiments or examples described in this specification. In addition, it should be noted that in this specification, the terms "first", "second" and the similar terms are only used for descriptive purposes, and cannot to be understood as indicating or implying relative importance or implicitly specifying the number of technical features indicated.

The above statement is only a specific implementation of the present disclosure, but the scope of protection of the present disclosure is not limited thereto. Any person skilled in the art who can readily think of changes or substitutions inside the scope of the technology disclosed in the disclosure should be covered by the scope of protection of the present disclosure. Therefore, the scope of protection of the present disclosure shall be based on the scope of protection of the claims.

What is claimed is:

1. A transistor device, comprising a gate, a gate insulator, and a drift region stacked with a body region in a first direction, wherein the gate comprises a top surface, a bottom surface arranged opposite to the top surface, and a side surface between the top surface and the bottom surface, the bottom surface is in the first direction of the top surface, the gate insulator covers the bottom surface and at least a portion of the side surface of the gate, the gate insulator comprises a sidewall and a bottom, the body region covers a portion of the sidewall of the gate insulator, and the gate insulator is extended from the surface of the drift region facing the body region to the drift region along the first direction;

wherein the body region comprises a first subregion, a second subregion and a third subregion arranged sequentially along a second direction, the second direction is perpendicular to the first direction and pointing to a direction away from the gate insulator, wherein an average carrier concentration in the first subregion and an average carrier concentration in the third subregion are greater than an average carrier concentration in the second subregion;

wherein the transistor device further comprises a dopant concentration rising region in the drift region and located aligning with the second subregion along the first direction, the average dopant concentration of the doped substance of the second conductive type in the dopant concentration rising region is greater than the average dopant concentration of the doped substance of the second conductive type in the drift region.

2. The transistor device according to claim 1, wherein the average carrier concentration in the second subregion is 60% to 80% of the average carrier concentration in the third subregion.

3. The transistor device according to claim 2, wherein the average carrier concentration in the first subregion is 90% to 100% of the average carrier concentration in the third subregion.

4. The transistor device according to claim 3, wherein both the first subregion and the third subregion comprise a doped substance of a first conductive type, the drift region comprises a doped substance of a second conductive type, and the second subregion comprises a doped substance of the first conductive type and a doped substance of the second conductive type; and in the second subregion, the average dopant concentration of the doped substance of the second conductive type is from 20% to 40% of the average dopant concentration of the doped substance of the first conductive type.

5. The transistor device according to claim 2, wherein both the first subregion and the third subregion comprise a doped substance of a first conductive type, the drift region comprises a doped substance of a second conductive type, and the second subregion comprises a doped substance of the first conductive type and a doped substance of the second conductive type; and in the second subregion, the average dopant concentration of the doped substance of the second conductive type is from 20% to 40% of the average dopant concentration of the doped substance of the first conductive type.

6. The transistor device according to claim 1, wherein a distance between the midline along the first direction of the second subregion and the sidewall of the gate insulator ranges from 5 nm to 10 nm.

7. The transistor device according to claim 1, wherein a width of the second subregion along the second direction is 60% to 100% of a distance between the midline along the first direction of the second subregion and the sidewall of the gate insulator.

8. The transistor device according to claim 1, wherein base materials of the body region and the drift regions are silicon carbide.

9. The transistor device according to claim 1, wherein a dimension of the gate insulator in the second direction is 2 to 5 times a dimension of the gate insulator in the first direction.

10. A manufacturing method of a transistor device, comprising:

providing an initial body region and a drift region stacked along a first direction;

forming a gate trench inside the initial body region and the drift region, wherein the gate trench passes through the initial body region from a surface of the initial body region backward away from the drift region in the first direction, and is extended to the drift region; and injecting a doped substance into the initial body region by an ion implantation process to obtain a buried trench body region, wherein the buried trench body region comprises a first subregion, a second subregion and a third subregion, the first subregion, the second subregion and the third subregion are sequentially arranged in a second direction, the second direction is perpendicular to the first direction and pointing to a direction away from the gate trench, wherein an average carrier concentration in the first subregion and an average carrier concentration in the third subregion are greater than an average carrier concentration in the second subregion;

wherein the transistor device further comprises a dopant concentration rising region in the drift region and located aligning with the second subregion along the first direction, the average dopant concentration of the doped substance of the second conductive type in the dopant concentration rising region is greater than the average dopant concentration of the doped substance of the second conductive type in the drift region.

11. The manufacturing method according to claim 10, wherein the step of injecting a doped substance into the initial body region by the ion implantation process to obtain a buried trench body region comprises:

injecting an ion beam containing the doped substance into the initial body region through the gate trench in a direction at a non-zero angle to the second direction.

12. The manufacturing method according to claim 11, wherein the step of injecting an ion beam containing the doped substance into the initial body region through the gate trench in a direction at a non-zero angle to the second direction comprises:

injecting the ion beam into the initial body region at different angles during at least two ion injection processes.

13. The manufacturing method according to claim 11, wherein the angle between the ion beam and the second direction ranges from 30° to 60°.

14. The manufacturing method according to claim 10, wherein the temperature of the ion implantation process ranges from 500° C. to 700° C.

15. The manufacturing method according to claim 10, wherein the base material of the initial body region and the drift region is silicon carbide.

16. The manufacturing method according to claim 10, further comprising: after injecting a doped substance into the initial body region by an ion implantation process to obtain a buried trench body region, annealing the buried trench body region in the range of 1500° C. to 1700° C.

17. The manufacturing method according to claim 12, wherein the angle between the ion beam and the second direction ranges from 30° to 60°.

18. The manufacturing method according to claim 15, further comprising: thermally oxidizing the gate trench to form a silicon oxide gate oxide on the inner wall of the gate trench.

* * * * *